Oct. 16, 1928. Re. 17,105

A. CROSSLEY

AMPLIFYING SYSTEM

Original Filed Nov. 10, 1925

INVENTOR.

Alfred Crossley,

BY Harold Dodd,

ATTORNEY.

Reissued Oct. 16, 1928.

Re. 17,105

UNITED STATES PATENT OFFICE.

ALFRED CROSSLEY, OF WASHINGTON, DISTRICT OF COLUMBIA, ASSIGNOR TO WIRED RADIO, INC., OF NEW YORK, N. Y., A CORPORATION OF DELAWARE.

AMPLIFYING SYSTEM.

Original No. 1,651,810, dated December 6, 1927, Serial No. 68,121, filed November 10, 1925. Application for reissue filed December 23, 1927. Serial No. 242,261.

My invention relates broadly to radio transmitting systems and more particularly to means for eliminating self-oscillations in the circuits of radio transmission systems.

One of the objects of my invention is to provide a constant frequency controlled electron tube transmission system in which maximum energy is impressed upon an antenna ground system without losses occasioned by self-oscillations normally present in the electron tube circuits of a radio transmitter.

Another object of my invention is to provide means for connection in the plate lead close to the plate terminal of an electron tube amplification system of a radio transmitter for eliminating high frequency self-oscillations in the amplification system with negligible effect on the amplifier output at the required frequency.

Still another object of my invention is to provide an arrangement of radio transmission system in which a piezo-electrical crystal controlled oscillator is connected with an electron tube amplification system for impressing high frequency oscillations upon the electron tube amplification system without loss in the amplification system arising out of the generation of self-oscillations which normally tend to reduce the radiation of the transmission system.

A further object of my invention is to provide an electrical circuit arrangement for a high frequency electron tube amplification system in a radio transmitter wherein a resistance is connected in series with the plate lead of the amplifier and close to the plate terminal thereof and connected in series with the high frequency resonance circuit of the amplifier for increasing the resistance of the circuit to such an extent that the regenerative property of the grid-plate capacity is not sufficient to cause oscillations.

Figure 1:
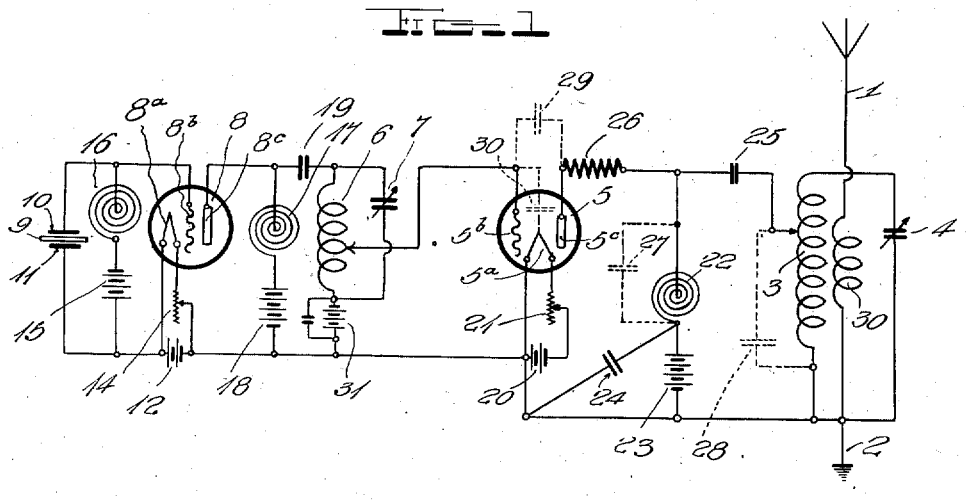
Figure 2:
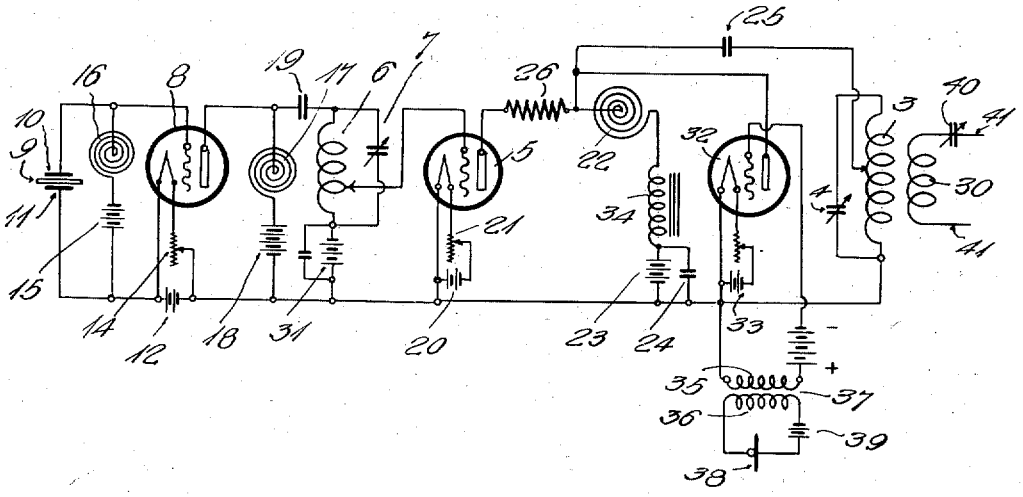

My invention will be more fully understood from the specification hereinafter following by reference to the accompanying drawings, wherein in Figure 1, my invention is illustrated as applied to the high frequency power amplifier system of a piezo-electric crystal controlled oscillator showing the means which I provide for eliminating self-oscillations in the amplification system; and Fig. 2 shows my invention in connection with a modulation circuit in a transmitter apparatus employed in a wired radio broadcasting system.

In the development of piezo-electric crystal controlled transmitters, I have found that serious difficulty is encountered in connecting a power amplifier with the piezo-electric crystal controlled oscillator by the presence of self-oscillations in the various stages of amplification. This difficulty is aggravated by the use of electron tubes which have low plate impedance and high inter-electrode capacities. The self-oscillations in the electron tube amplifier system of a radio transmitter are of a high frequency nature and may be attributed to the inductance of the grid and plate leads together with the inter-electrode capacities and distributed capacity of the choke and plate inductance coil systems. I have discovered a method for eliminating the self-oscillations as set forth in detail in the drawing, where reference characters 1 and 2 designate an antenna ground system inductively connected to an oscillatory circuit comprising inductance 3 and capacity 4 by means of the coupling coil 30. The electron tube 5 containing filament electrode $5^a$, grid electrode $5^b$ and plate electrode $5^c$, is arranged as a high frequency power amplifier in the transmitting circuit. The input circuit of the power amplifier tube 5 connects with the oscillatory output circuit containing inductance 6 and capacity 7 of the oscillatory tube 8. The grid electrode $5^b$ of tube 5 is properly biased by means of battery 31. The input circuit of the oscillatory tube 8, between grid electrode $8^b$ and filament electrode $8^a$, includes the piezo-electric crystal 9 connected between metallic plates 10 and 11 which connect respectively with grid electrode $8^b$ and filament electrode $8^a$. The filament electrode $8^a$ is heated from battery 12 under control of rheostat 14. The input circuit of the oscillator tube 8 is shunted by means of a series circuit including source of potential 15 in series with radio frequency choke 16 by which a negative potential is impressed upon grid electrode $8^b$ and the piezo-electric crystal control circuit is operated at substantially no load. The output circuit of the oscillator tube 8 contains the radio frequency choke coil 17 and high potential battery 18 for supplying the positive potential to the plate 8c. Condenser 19 is interposed in the plate lead in series with the oscillatory circuit containing inductance 6 and condenser 7. The power amplifier tube 5 has its filament 5a heated from a suitable source 20 under control of rheostat 21 and in the output circuit I provide a radio frequency choke coil 22 and a source of high potential 23 shunted by a radio frequency by-pass condenser 24. Condenser 25 is interposed in series with an oscillatory system 3—4 which connects with the radiating circuit. I find that by inserting a resistance 26 in the plate lead of the tube 5 close to the plate terminal 5c that high frequency self-oscillations are prevented with negligible effect on the amplifier output at the required frequency. It will be noted that the resistance 26 is connected immediately adjacent the terminal of plate electrode 5c at which point it is most effective in the circuit. The resistance 26 is also arranged in series with the high frequency resonance circuit 3—4 and with the radio frequency choke coil 22 in the high potential circuit. The high frequency resonance circuit is extended to include the inductance of the plate and choke coil leads and the distributed capacity of the choke and plate coils as represented by dotted line condensers 27 and 28, and also the inter-electrode capacities as shown by the dotted line condensers 29 and 30, disposed between the grid and plate electrodes and between the grid and filament electrodes. The resistance 26 is positioned directly in the high frequency circuit in such manner that it carries all of the high frequency current. Inasmuch as the feed back which causes undesired high frequency oscillations is due to the capacity between grid and plate of the tube which is of a fixed value, it can be assumed that any means used to increase the resistance of the high frequency circuit will affect the feed back qualities of the circuit. It is therefore possible to so increase the resistance of the circuit that the feed back qualities of the grid-plate capacity are not sufficient to cause oscillations. By the circuit arrangement of the present invention I completely eliminate the undesired frequency oscillations.

As heretofore pointed out the insertion of resistance 26 has a negligible effect on the output at the desired frequency, because this resistance has small value compared with the plate circuit impedance. The ratio of this resistance to the impedance of various tubes now employed in high power transmitters varies from one part in thirty, to one part in one hundred when we consider the operating or dynamic impedance of such tubes. By eliminating the undesired oscillatory currents in piezo-electric crystal controlled transmitters, I am enabled to impress the full effect of the constant frequency oscillations upon the radiating circuit and thereby greatly increase the efficiency of the transmission system.

In Fig. 2 I have shown my invention as applied to a broadcasting transmitter system for wired radio operation where a line wire system 41 is provided and high frequency carrier currents impressed thereon through inductance 30 and tuning condenser 40, where the inductance 30 is coupled with the inductance 3 in the output circuit of the power amplifier 5. The oscillator 8 is controlled by piezo-electric crystal 9 as described in connection with Fig. 1. A modulator tube 32 is connected across the power amplifier circuit as shown, where a low frequency choke coil 34 is introduced in the output circuit of the power amplifier tube 5 in series with the high potential battery 23.

The modulator tube is controlled through audio frequency transformer 37 having primary winding 36 and secondary winding 35. The primary winding is connected in the voice control circuit including battery source 39 and microphone 38. The constant frequency oscillations under control of the piezo-electric crystal 9 are impressed upon the line wire system 41 and modulated from microphone 38.

While I have shown preferred circuit arrangements, it will be understood that the principle of my invention may be applied to various combinations of circuits and that no limitations upon my invention are intended other than are imposed by the scope of the appended claims.

What I claim and desire to secure by Letters Patent of the United States is as follows:

1. In a high frequency transmission system the combination of a plurality of electron tubes each having grid, filament and plate electrodes, input and output circuits interconnecting said electrodes, a piezo-electric crystal connected in the input circuit of one of said electron tubes for controlling the generation of oscillations in the circuit of said electron tube, another of said electron tubes having its input circuit coupled with the output circuit of said first mentioned electron tube, the output circuit of said last mentioned tube including parallel branch circuits, and a resistance connected in series with said parallel branch circuits and directly connected to the plate electrode of said last mentioned electron tube whereby said electron tube operates to generate oscillations of a frequency determined by said piezo-electric crystal without interference from undesired self-oscillatory current in the circuits thereof.

2. In a high frequency transmission system the combination of a plurality of electron tubes, having grid, filament and plate electrodes, input and output circuits interconnecting said electrodes, a piezo-electric crystal connected in the input circuit of one of said electron tubes for controlling the generation of oscillations in the circuit of said electron tube, another of said electron tubes having its input circuit coupled with the output circuit of said first mentioned tube, the output circuit of said last mentioned electron tube comprising a pair of branch circuits, one branch circuit including oscillatory elements and another including a high potential source, and a resistance connected in series with each of said branch circuits and directly connecting to the terminal of the plate electrode of said last mentioned electron tube, whereby said electron tube operates as a power amplifier at the frequency of said piezo-electric crystal, while undesired self-oscillatory currents are eliminated.

3. A piezo-electric crystal controlled transmission system comprising a piezo-electric crystal element capable of producing constant frequency oscillations, an electron tube circuit for sustaining said oscillations, an electron tube power amplifier system connected to said electron tube circuit, a modulation circuit comprising an independent electron tube with the output circuit thereof connected to the output of said power amplifier and a resistance disposed in series between the plate electrode of said power amplifier tube and the plate electrode of said last mentioned electron tube independent of the coupling between said tubes for preventing the reaction of oscillatory currents upon said piezo-electric crystal element.

4. A piezo-electric crystal controlled transmission system comprising an electron tube circuit for sustaining the oscillations of a piezo-electric crystal element, a power amplifier including an electron tube system for increasing the amplitude of said oscillations a modulation circuit comprising an electron tube having its plate and filament electrode conductively connected across the output circuit of said power amplifier, and a resistance interposed in the connection between the plate electrode of said power amplifier and the plate electrode of said modulation circuit for preventing reaction of said power amplifier and modulation circuit upon said piezo-electric crystal element.

ALFRED CROSSLEY.